United States Patent
Hoechst et al.

(10) Patent No.: US 8,691,611 B2
(45) Date of Patent: Apr. 8, 2014

(54) METHOD FOR CREATING A MICROMECHANICAL MEMBRANE STRUCTURE AND MEMS COMPONENT

(75) Inventors: Arnim Hoechst, Reutlingen (DE); Jochen Reinmuth, Reutlingen (DE); Brett Diamond, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 277 days.

(21) Appl. No.: 13/290,905

(22) Filed: Nov. 7, 2011

(65) Prior Publication Data

US 2012/0126346 A1 May 24, 2012

(30) Foreign Application Priority Data

Nov. 23, 2010 (DE) .......................... 10 2010 061 795

(51) Int. Cl.
*H01L 21/3065* (2006.01)

(52) U.S. Cl.
USPC ....... 438/53; 438/704; 438/741; 257/E21.218

(58) Field of Classification Search
CPC ................................. H01L 21/2633
USPC ........................................... 438/741
See application file for complete search history.

(56) References Cited

U.S. PATENT DOCUMENTS

| | | | | |
|---|---|---|---|---|
| 5,064,165 A * | 11/1991 | Jerman | ......................... | 251/61.1 |
| 5,124,717 A * | 6/1992 | Campanelli et al. | ............. | 347/93 |
| 5,242,533 A * | 9/1993 | Trah et al. | ......................... | 438/52 |
| 6,590,280 B2 * | 7/2003 | Satou et al. | .................... | 257/682 |
| 7,214,324 B2 * | 5/2007 | Chilcott | ............................ | 216/2 |
| 2005/0028601 A1* | 2/2005 | Pedersen et al. | ................. | 73/718 |
| 2007/0077727 A1* | 4/2007 | Huang et al. | ................... | 438/444 |

FOREIGN PATENT DOCUMENTS

DE 42 41 045 5/1994

* cited by examiner

*Primary Examiner* — Stephen W Smoot
(74) *Attorney, Agent, or Firm* — Kenyon & Kenyon LLP

(57) ABSTRACT

In a method for manufacturing a micromechanical membrane structure, a doped area is created in the front side of a silicon substrate, the depth of which doped area corresponds to the intended membrane thickness, and the lateral extent of which doped area covers at least the intended membrane surface area. In addition, in a DRIE (deep reactive ion etching) process applied to the back side of the silicon substrate, a cavity is created beneath the doped area, which DRIE process is aborted before the cavity reaches the doped area. The cavity is then deepened in a KOH etching process in which the doped substrate area functions as an etch stop, so that the doped substrate area remains as a basic membrane over the cavity.

4 Claims, 5 Drawing Sheets

METHOD FOR CREATING A MICROMECHANICAL MEMBRANE STRUCTURE AND MEMS COMPONENT

BACKGROUND OF THE INVENTION

1. Field of the Invention

The present invention relates to a method for creating a micromechanical membrane structure in a silicon substrate in which a cavity is created in the substrate's back side in a DRIE (deep reactive ion etching) process, and the present invention further relates to MEMS components manufactured using the method according to the present invention.

2. Description of the Related Art

The DRIB process is described in published German Patent document DE 42 41 045 C1 as a method for anisotropic etching of silicon substrates. The goal of this method is to perform the etching only at a right angle to the substrate surface if possible. With appropriate masking of the substrate surface, structures having a relatively large aspect ratio may be created in this way.

The DRIE process is a time-controlled two-step process in which an etching step alternates with a passivation step. These two process steps are regulated independently of one another. The etching step includes an isotropic chemical etching process, and an anisotropic physical material removal, which attacks essentially at a right angle to the substrate surface, superimposed on the chemical etching process. The DRIE process provides for stopping the etching step after a short period of time to create a passivation layer on the masked and structured substrate surface. The vertical side walls of the etching recesses created in advance are also passivated here in particular. Therefore the side walls are protected against the chemical etching attack of the next etching step while the passivation layer on the horizontal surfaces of the etching recesses is removed again by the physical material removal, so that a chemical etching attack may take place here. The sequence of etching step and passivation step is repeated as often as needed until the intended structure depth is reached.

It is known that cavities may be created in the back side of a silicon substrate with the aid of the DRIE process, thereby exposing membranes in the substrate's front side. However, this procedure has proven to be problematical in two regards. Since the DRIE process is a time-controlled process, the variance in the achieved etching depth and thus also the variance in the membrane thickness are relatively great with the given process parameters. Furthermore, the bottom of the cavity, i.e., the membrane's back side, is relatively uneven due to the process. Both of the aforementioned aspects have undefined effects on the mechanical properties of the membrane created in this way. However, further processing of such a membrane has also proven to be problematical. For example, the process management with subsequent structuring depends to a significant extent on the membrane thickness. Furthermore, the use of lithographic methods for definition of the membrane structure requires a preferably planar membrane surface or membrane's back side when the structuring is to take place starting from the substrate's back side.

In practice, membranes are often created in the front side of a silicon substrate in an anodic KOH back-side etching process. For this purpose, an $n^+$-doped area extending over the entire membrane surface area and functioning as an etch stop limit for the KOH etching process is exposed in the top side of the substrate. Although membranes having a well-defined thickness and a very planar back side may be manufactured in this way, the rear opening in the cavern thus created beneath the membrane must be much larger than the membrane surface area because openings in the form of truncated pyramids are formed during KOH etching. This limits the miniaturization options of MEMS components manufactured accordingly.

BRIEF SUMMARY OF THE INVENTION

A method for permitting the implementation of defined micromechanical membrane structures on an extremely small chip surface is proposed according to the present invention.

According to the present invention, a doped area is created for this purpose in the substrate's front side, the depth of this area corresponding to the intended membrane thickness and its lateral extent covering at least the intended membrane surface area. Regardless of this, a cavity is created in the substrate's back side beneath the doped area in a DRIE process. This DRIE process is aborted before reaching the doped area. The cavity is then deepened in a KOH etching process, whereupon the doped substrate area functions as an etch stop, so that the doped substrate area above the cavity remains as the basic membrane.

According to this, the present invention is based on a combination of the time-controlled DRIE process with an etch stop-limited KOH process in which the advantages of the one process compensate for the disadvantages of the other. It has been recognized that with the aid of the DRIE process, caverns having a much higher aspect ratio may be created in the back side of the silicon substrate than in a KOH etching process. This advantage of the anisotropic DRIE process in comparison with KOH etching is utilized according to the present invention to achieve a very high degree of component miniaturization. According to the present invention, however, the cavern should be finalized with the aid of a KOH etching process. In contrast with the time-controlled DRIE process, the KOH etching process may be limited by an etch stop created in the substrate. This advantage of the KOH etching process in comparison with the DRIE process is utilized according to the present invention to manufacture membranes having a defined thickness, which is uniform over the entire membrane surface area. The lateral extent and the thickness of the membrane are independent of the depth of the cavern.

The membranes exposed according to the present invention may subsequently also be provided with structuring, depending on the application. It is advantageous in particular if such a structuring proceeds from the membrane's back side because the substrate's front side may then be processed independently of the membrane. In this case, the membrane's back side, i.e., the bottom of the cavity, must be masked accordingly. It has proven to be particularly advantageous that the back side of a membrane exposed according to the present invention is extremely planar. This is a prerequisite for use of a lithographic method for definition of the membrane structure in the masking layer. The very planar membrane's back side allows the use of special lighting devices having only a shallow depth of field but a very high resolution.

As already mentioned, the rear structuring of the membranes exposed according to the present invention offers the possibility of independent processing of the substrate's front side. In a particularly advantageous continuation of the method according to the present invention, at least one sacrificial layer is applied to the doped substrate's front side to then create a second membrane structure over this sacrificial layer using the methods of surface micromechanics. This makes it possible to implement MEMS components for a wide variety of applications having two independently structured membrane structures situated one above the other.

These membrane structures may be linked mechanically and/or electrically, depending on the function of the component.

The production of microphone structures may be mentioned here as an example of the versatile possibilities for use of the method according to the present invention. With the aid of the lithographic method applied to the membrane's back side, vent openings in the basic membrane may be created in this case.

Another example is the production of acceleration sensor structures or actuator structures. In this case, spring structures, for example, may be created in the basic membrane as a suspension for a seismic mass with the aid of the lithographic method applied to the membrane's back side.

DETAILED DESCRIPTION OF THE INVENTION

Figure 1A:
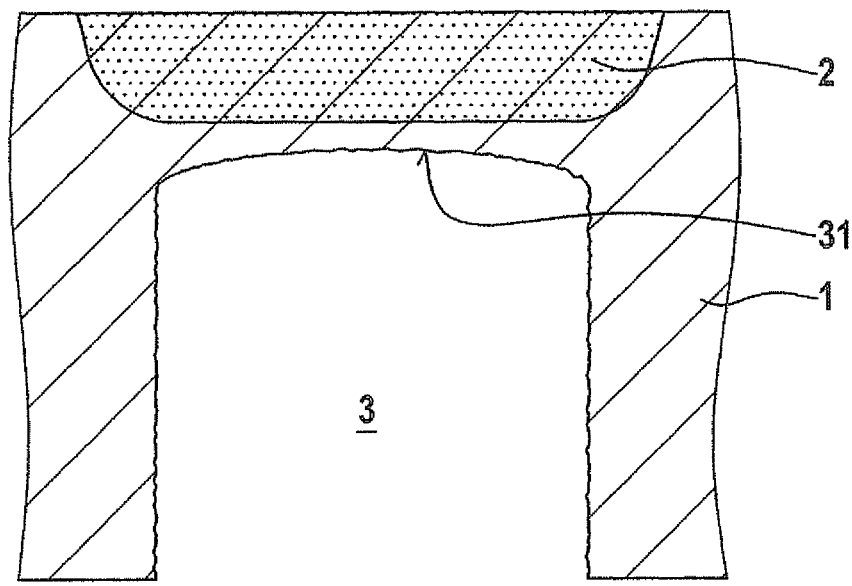
FIGS. 1a through 1c each show a schematic sectional diagram of a silicon substrate in the course of the method according to the present invention for creating a membrane structure.

The method according to the present invention for creating a micromechanical membrane structure is directed to a silicon substrate. The exemplary embodiment described here is a p-doped silicon substrate 1 in whose top side a membrane of a defined thickness and having a defined membrane surface area is to be exposed. For this purpose, an n$^+$-doped area 2, the depth of which corresponds to the intended membrane thickness and the lateral extent of which is at least slightly larger here than the intended membrane surface area, is created in the front side of substrate 1. Next, in a DRIB (deep reactive ion etching) process, a cavity 3 is created in the substrate's back side beneath n$^+$-doped area 2. The opening cross section of this cavity 3 must be selected to be somewhat larger than the intended membrane surface area. According to the present invention, the DRIE process is limited in time in such a way that cavity 3 does not extend all the way up to n$^+$-doped substrate area 2. FIG. 1a shows substrate 1 after the DRIE process is aborted. Bottom 31 of cavity 3 is located here at a distance of approximately 10 µm-50 µm from the interface of n$^+$-doped substrate area 2. Due to the process, bottom surface 31 of cavity 3 is curved and uneven.

Figure 1B:
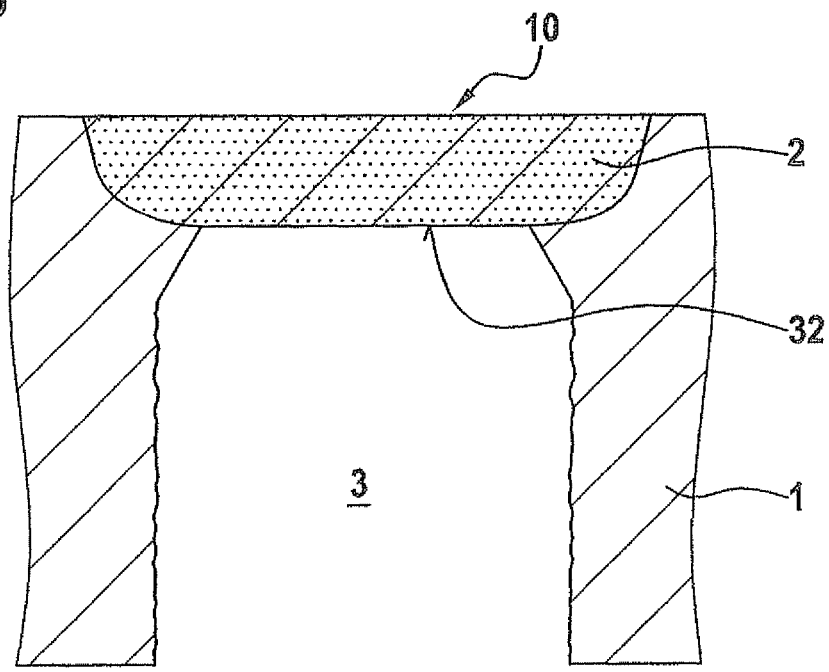

Cavity 3 is then deepened in an anodic KOH etching process. The n$^+$-doped substrate area 2 or its interface functions as an etch stop for this etching process. Accordingly, n$^+$-doped substrate area 2 remains above cavity 3 as basic membrane 10, as illustrated in FIG. 1b. The lower area of the side wall of cavity 3 has the inclination characteristic of KOH etching, which is why the opening cross section of cavity 3 at the rear has been selected to be somewhat larger than the intended membrane surface area. It is important here that the depth of cavity 3 and thus also the thickness of basic membrane 10 may be predefined very precisely with the aid of n$^+$-doped substrate area 2. Bottom surface 32 of cavity 3 is planar over the entire area, corresponding to the shape of the etch stop limit and is oriented in parallel with the substrate surface.

Figure 1C:
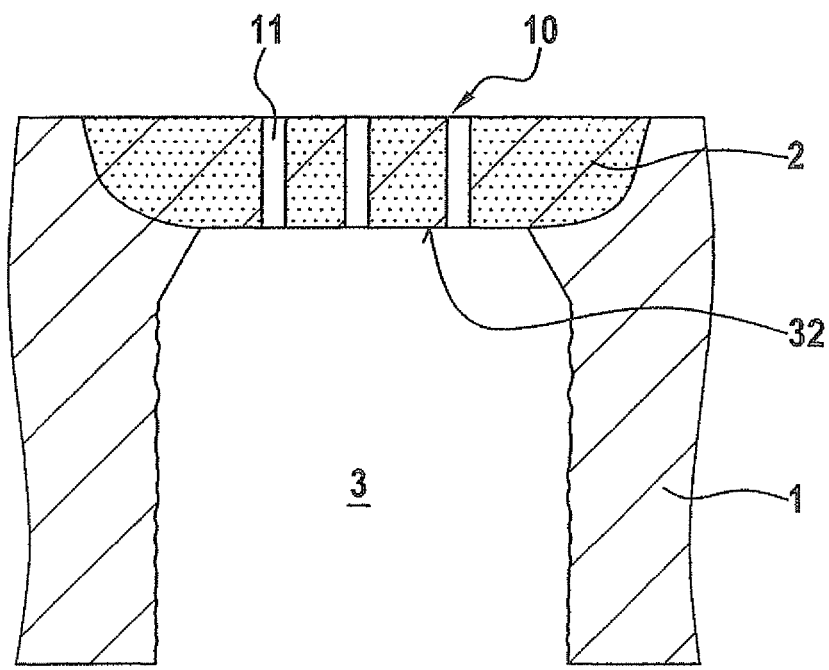

In the exemplary embodiment described here, basic membrane 10 is then structured starting from the substrate's back side—i.e., regardless of any processing of the substrate's front side. The definition of the membrane structure is achieved with the aid of a masking layer, which is applied to the back side of basic membrane 10 and is structured accordingly. For this purpose, the substrate's back side is provided with a homogeneous photoresist layer in a spray lacquer process, covering bottom surface 32 of cavity 3 but not completely filling up cavity 3. The definition of the membrane structure is now accomplished through corresponding lighting of the photoresist layer. The evenness and parallel alignment of cavity bottom 32 with respect to the substrate surface allow the use of special lighting devices having a very high resolution, although this is to the detriment of the depth of field. This also makes it possible to very accurately define and position even extremely small openings, e.g., vent openings of microphone structures. FIG. 1c shows basic membrane 10 after structuring of the back side in which through-openings 11 have been created.

On the basis of FIGS. 2 through 4, it is explained below as an example the possibilities offered by structuring the back side of the basic membrane independently of processing the substrate's front side during manufacturing of MEMS components. Thus the method according to the present invention allows implementation of a second membrane structure above the basic membrane. This second membrane structure is formed by methods of surface micromechanics in a layer structure on the silicon substrate. For this purpose, at least one sacrificial layer is applied to the substrate surface, preferably before any structuring of the basic membrane, and is then removed again only after the structuring of the basic membrane and after the creation of the second membrane structure above the basic membrane, to expose the basic membrane and the second membrane structure.

Figure 2A:
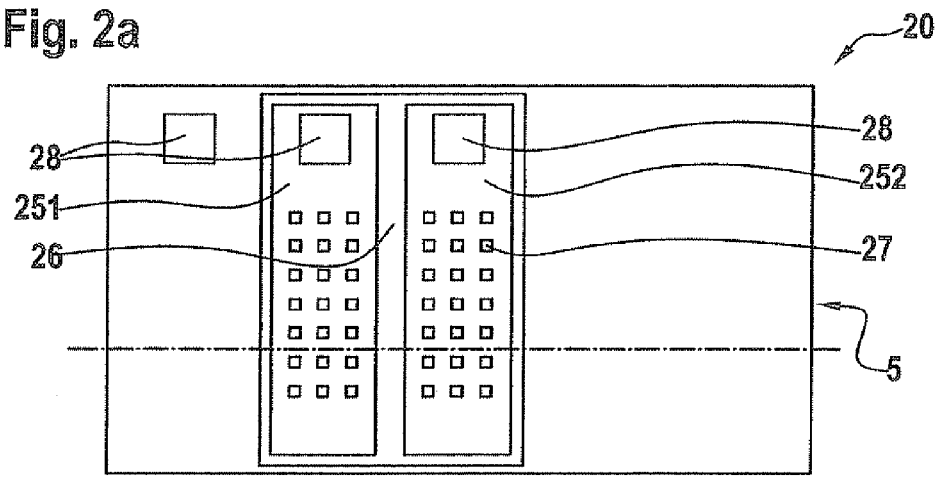
FIGS. 2a through 2c show a view of the top side, a sectional view and a rear view of an MEMS component before removal of the sacrificial layer between the basic membrane and the layer structure.
Figure 2B:
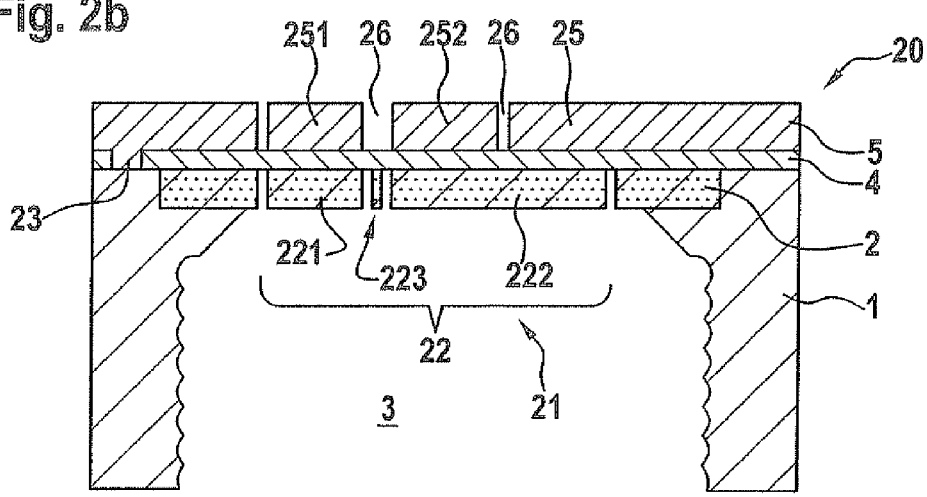
Figure 2C:
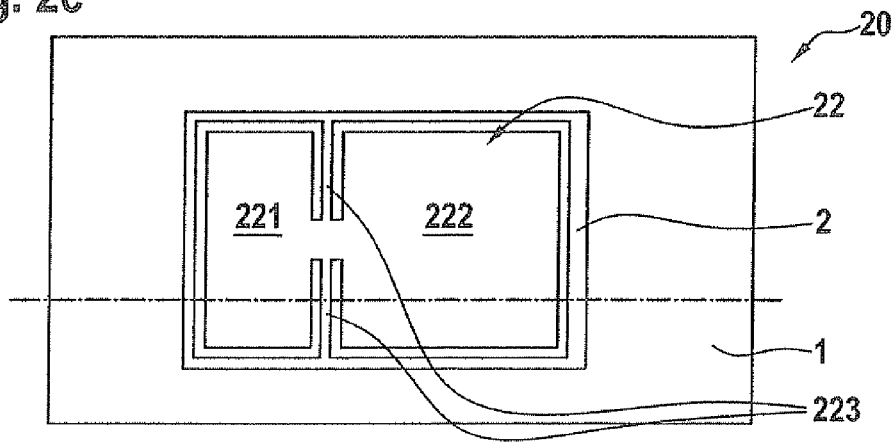
Figure 3A:
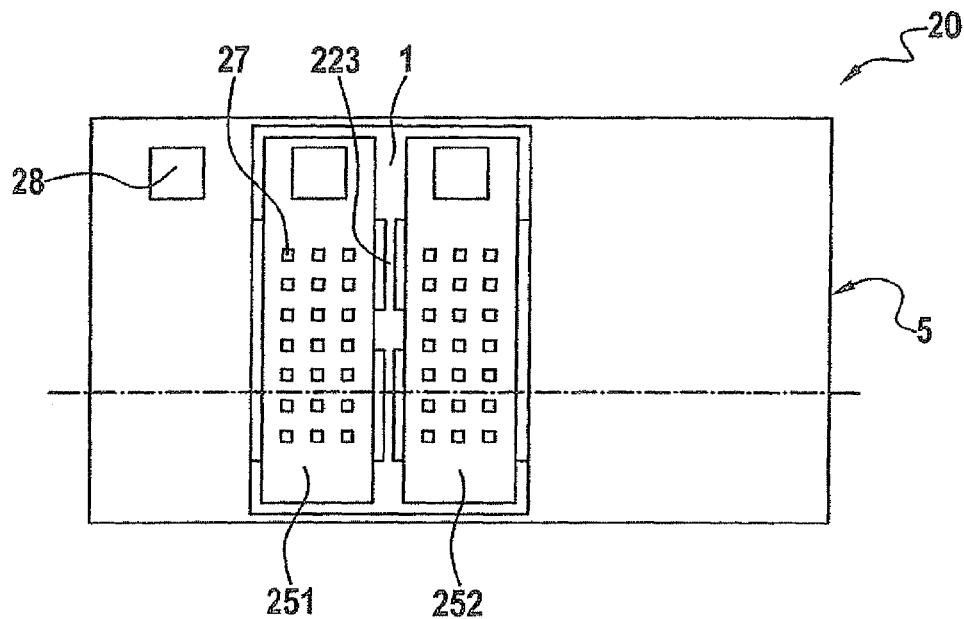
FIGS. 3a and 3b show a view of the top side and a sectional view of the MEMS component after removal of the sacrificial layer between the basic membrane and the layer structure.

As an example of such an MEMS component, FIGS. 2 and 3 show a sensor element 20 with which accelerations in the z direction are detectable. FIGS. 2a through c show the sensor structure before removal of sacrificial layer 4, and FIG. 3a, b show the sensor structure after removal of the sacrificial layer.

Sensor element 20 was produced on the basis of a silicon substrate 1 and includes a basic membrane 21, which is formed in the surface of substrate 1 and spans a cavern 3 in the substrate's back side. This cavern 3 was created in a time-controlled DRIE process and a subsequent KOH etching process including an etch stop in the form of a doped substrate area 2—as explained in detail in conjunction with FIGS. 1a, b. Due to the DRIE process, the side wall in the opening area of cavern 3 is oriented essentially at a right angle to the plane of the substrate. Only in the bottom region does cavern 3 assume the form of a truncated pyramid, which is attributed to the KOH etching process. This characteristic of cavern 3 is illustrated in particular by the two sectional diagrams in FIGS. 2b and 3b. By structuring the membrane's back side—as described in detail in conjunction with FIG. 1c-a rocker structure 22 has been formed in basic membrane 21. It includes two paddles 221 and 222 of different sizes, which are connected to one another via a web-type spring structure 223 and are also connected to the substrate frame. Spring structure 223 acts as a torsion spring. FIG. 2c shows the layout of basic membrane 21.

Each of the two paddles 221 and 222 functions as a movable electrode of a measuring capacitance with which the deflection of paddle 221 or 222 is detected. Stationary counterelectrodes 251 and 252 of the measuring capacitances are implemented in an epipolysilicon layer 5 via rocker structure 22. For this purpose, an oxide layer was initially created as sacrificial layer 4 on the substrate surface and then structured. Next, a thick epipolysilicon layer 5 was deposited on structured sacrificial layer 4. An electrical contact 23 between epipolysilicon layer 5 and substrate 1 was formed at the side of basic membrane 21. Finally, epipolysilicon layer 5 was structured in a front-side etching process in which insulation trenches 26 for the definition of counterelectrodes 251 and 252 were produced on the one hand, and on the other hand vent openings 27 were produced to improve the damping properties of sensor element 20. The layout of epipolysilicon layer 5 is shown in FIG. 2a. This diagram also shows the configuration of bond pads 28 for electrical contacting of sensor element 20.

Figure 3B:
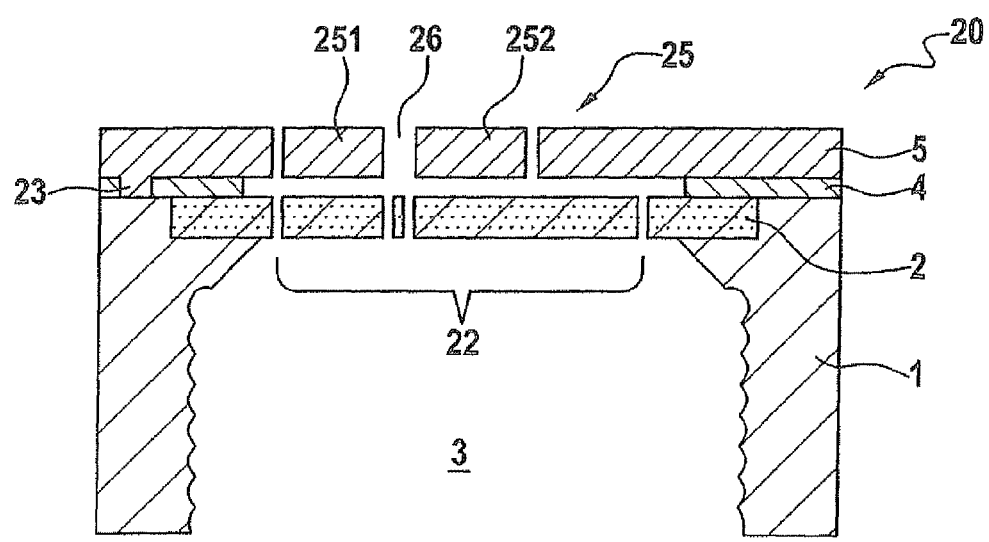
Figure 4:
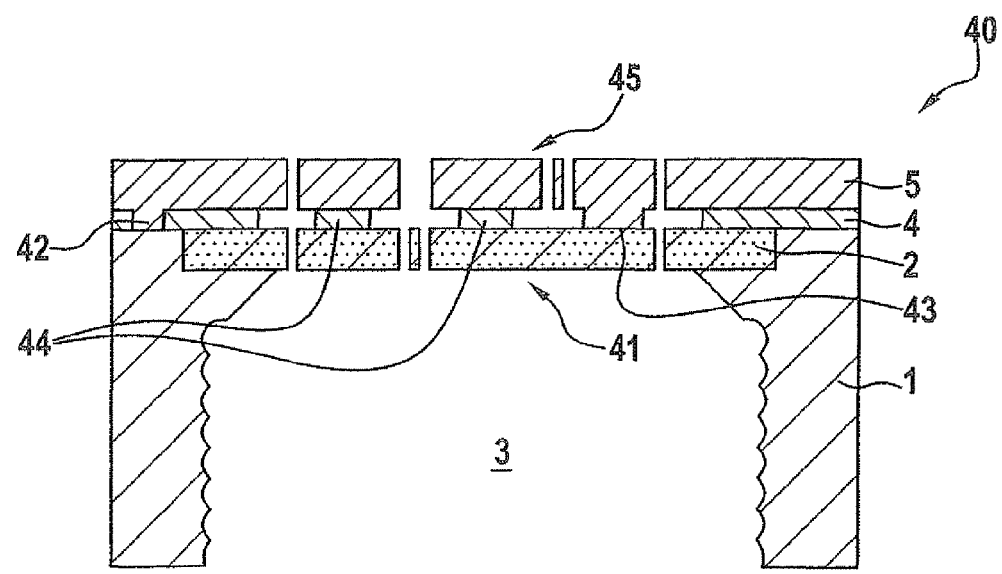
FIG. 4 shows a sectional view of another MEMS component in which the basic membrane and another membrane are linked mechanically and electrically via the basic membrane.

Only after basic membrane 21 and epipolysilicon layer 5 have been structured independently of one another is sacrificial layer 4 removed in the area above basic membrane 21 to expose rocker structure 22. A second membrane structure 25 having two stationary counterelectrodes 251 and 252 is then formed in epipolysilicon layer 5. FIGS. 3a and 3b show that both counterelectrodes 251 and 252 are rigidly connected to substrate 1 in the area of bond pads 28 and on the opposite side via sacrificial layer material 4. The etching attack to remove the sacrificial layer material may start from the substrate's back side via cavern 3 and the openings in basic membrane 21 or may also take place in a front-side etching process via insulation trenches 26 and vent openings 27 in epipolysilicon layer 5.

The configuration of an MEMS component having a basic membrane in the silicon substrate and a second membrane structure above the basic membrane, which is formed in an epipolysilicon layer, allows both mechanical and electrical coupling between the basic membrane and the second membrane structure. This will now be explained with reference to FIG. 4, which shows a component 40 having a basic membrane 41 and a second membrane structure 45 above basic membrane 41. As in the case of sensor element 20, basic membrane 41 was created and structured by processing the substrate's back side, and second membrane structure 45 was structured out of a thick epipolysilicon layer 5. However, in the case of component 40, sacrificial layer 4 was structured not only over the boundary area of basic membrane 41 but was also structured directly over basic membrane 41, so that epipolysilicon layer 5, which was grown thereafter, was in contact with silicon substrate 1 not only via a first electrical contact 42 next to the basic membrane but also second membrane structure 45 is connected to basic membrane 41, namely via a second electrical contact 43. Furthermore, dielectric sacrificial layer 4 was not removed entirely, so that basic membrane 41 and second membrane 45 are additionally linked mechanically via remaining sacrificial layer columns 44.

What is claimed is:

1. A method for manufacturing a micromechanical membrane structure, comprising:
   providing a cavity in a back side of a silicon substrate using a DRIE (deep reactive ion etching) process;
   providing a doped area in a front side of the substrate, wherein the depth of the doped area corresponds to the thickness of a desired membrane and the lateral extent of the doped area covers at least the surface area of the desired membrane;
   aborting the DRIE process before the bottom of the cavity reaches the doped area; and
   deepening the cavity using a KOH etching process in which the doped substrate area functions as an etch stop, so that the doped substrate area remains over the cavity as a basic membrane.

2. The method as recited in claim 1, wherein the DRIE process is aborted when the distance between the bottom of the cavity and the doped area is approximately 10 µm-50 µm.

3. The method as recited in claim 2, wherein the basic membrane is structured with the aid of a lithographic process applied to the membrane's back side.

4. The method as recited in claim 2, wherein at least one sacrificial layer is applied to the doped front side of the substrate, and wherein at least one additional membrane structure is created over the sacrificial layer using surface micromechanics process.

* * * * *